United States Patent
Hartjes et al.

(10) Patent No.: US 9,684,243 B2
(45) Date of Patent: Jun. 20, 2017

(54) BLOCKING ELEMENT FOR PROTECTING OPTICAL ELEMENTS IN PROJECTION EXPOSURE APPARATUSES

(71) Applicant: Carl Zeiss SMT GMBH, Oberkochen (DE)

(72) Inventors: Joachim Hartjes, Aalen (DE); Bernhard Sitek, Heidenheim (DE); Guenther Dengel, Heidenheim (DE); Maik-René Piatkowski, Diensdorf-Radlow (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 153 days.

(21) Appl. No.: 14/639,828

(22) Filed: Mar. 5, 2015

(65) Prior Publication Data

US 2015/0177626 A1 Jun. 25, 2015

Related U.S. Application Data

(63) Continuation of application No. PCT/EP2013/068383, filed on Sep. 5, 2013.
(Continued)

(30) Foreign Application Priority Data

Sep. 5, 2012 (DE) .................. 10 2012 215 697

(51) Int. Cl.
*G03B 27/72* (2006.01)
*G03F 7/20* (2006.01)

(52) U.S. Cl.
CPC .......... *G03F 7/70191* (2013.01); *G03F 7/702* (2013.01); *G03F 7/7085* (2013.01);
(Continued)

(58) Field of Classification Search
CPC .. G03F 7/70191; G03F 7/702; G03F 7/70308; G03F 7/70483; G03F 7/70575; G03F 7/7085; G03F 7/70916
(Continued)

(56) References Cited

U.S. PATENT DOCUMENTS

2004/0150802 A1 8/2004 Noehte et al.
2007/0001127 A1 1/2007 Reiley et al.
(Continued)

FOREIGN PATENT DOCUMENTS

DE 102008041628 A1 3/2009
DE 102012210035 A1 5/2013
(Continued)

OTHER PUBLICATIONS

International Search Report and Written Opinion in counterpart International Application No. PCT/EP2013/068383, mailed Jan. 22, 2014.
(Continued)

*Primary Examiner* — Peter B Kim
(74) *Attorney, Agent, or Firm* — Edell, Shapiro & Finnan, LLC

(57) ABSTRACT

A projection exposure apparatus for microlithography, in particular an EUV projection exposure apparatus, having a beam path along which propagates electromagnetic radiation with which the projection exposure apparatus is operated, and having at least one filter (55) arranged in the beam path, wherein the projection exposure apparatus furthermore comprises at least one sensor device for monitoring the filter, wherein at least one blocking element (60) is provided which is movable between a standby position and a bather position, and wherein the movement of the blocking element can be effected at least in a manner dependent on a signal of
(Continued)

the sensor device. An associated method for operating an apparatus of this type is also disclosed.

20 Claims, 7 Drawing Sheets

Related U.S. Application Data

(60) Provisional application No. 61/696,849, filed on Sep. 5, 2012.

(52) U.S. Cl.
CPC ...... *G03F 7/70308* (2013.01); *G03F 7/70483* (2013.01); *G03F 7/70575* (2013.01); *G03F 7/70916* (2013.01)

(58) Field of Classification Search
USPC .......................................................... 355/71
See application file for complete search history.

(56) References Cited

U.S. PATENT DOCUMENTS

| | | |
|---|---|---|
| 2010/0128367 A1 | 5/2010 | Beckenbach et al. |
| 2011/0235012 A1 | 9/2011 | Fischer et al. |
| 2014/0028989 A1 | 1/2014 | Butscher et al. |

FOREIGN PATENT DOCUMENTS

| | | |
|---|---|---|
| WO | 2009033639 A2 | 3/2009 |
| WO | 2012048974 A1 | 4/2012 |

OTHER PUBLICATIONS

Office Action in corresponding German Application No. 102012215697.6, dated Mar. 8, 2013, along with an English translation.

BLOCKING ELEMENT FOR PROTECTING OPTICAL ELEMENTS IN PROJECTION EXPOSURE APPARATUSES

CROSS-REFERENCE TO RELATED APPLICATIONS

This application is a Continuation Application of International Application No. PCT/EP2013/068383, filed on Sep. 5, 2013, which claims benefit under 35 U.S.C. 119(e) of U.S. Provisional No. 61/696,849, filed Sep. 5, 2012, and which claims priority under 35 U.S.C. 119(a) to German Patent Application No. 10 2012 215 697.6, also filed Sep. 5, 2012. The entire disclosures of all three related applications are considered part of and are incorporated by reference into the disclosure of the present application in their respective entireties.

FIELD OF AND BACKGROUND OF THE INVENTION

The present invention relates to a projection exposure apparatus for microlithography, and to a method for operating such a projection exposure apparatus.

Microlithography projection exposure apparatuses serve for producing microstructured components through a photolithographic method. In this case, a structure-bearing mask, the so-called reticle, is illuminated with the aid of a light source unit and an illumination optical unit and is imaged onto a photosensitive layer with the aid of a projection optical unit. In this case, the light source unit provides a radiation that is directed into the illumination optical unit. The illumination optical unit serves to provide a uniform illumination with a predetermined angle-dependent intensity distribution at the location of the structure-bearing mask. For this purpose, various suitable optical elements are provided within the illumination optical unit. The structure-bearing mask illuminated in this way is imaged onto a photosensitive layer with the aid of the projection optical unit. In this case, the minimum structure size which can be imaged with the aid of such a projection optical unit is determined, inter alia, by the wavelength of the radiation used. The shorter the wavelength of the radiation, the smaller the structures that can be imaged with the aid of the projection optical unit. For this reason, it is advantageous to use radiation having the wavelength of 5 nm to 15 nm, that is to say light in the wavelength spectrum of extreme ultraviolet (EUV) light, such that projection exposure apparatuses of this type are also designated as EUV projection exposure apparatuses.

In order to use radiation having the wavelength of 5 nm to 15 nm, however, it is necessary to use a luminous source plasma as light source. A light source unit of this type can be designed for example as a laser plasma source (LPP Laser Pulsed Plasma). With this type of source, a narrowly delimited source plasma is generated by a small material droplet being produced by a droplet generator and being brought to a predetermined location, where the material droplet is irradiated with a high-energy laser, such that the material undergoes transition to a plasma state and emits radiation in the wavelength range of 5 nm to 15 nm. By way of example, an infrared laser having the wavelength of 10 µm is used as the laser. Alternatively, the light source unit can also be designed as a discharge source, in which the source plasma is generated with the aid of a discharge. In both cases, alongside the desired radiation having a first wavelength in the range of 5 nm to 15 nm, which is emitted by the source plasma, radiation having a second, undesired wavelength also occurs. This involves e.g. radiation emitted by source plasma outside the desired range of 5 nm to 15 nm or, particularly when a laser plasma source is used, laser radiation which was reflected from the source plasma. Therefore, the second wavelength is typically in the infrared range having wavelengths of 0.78 µm to 1000 µm, in particular in the range of 3 µm to 50 µm. During the operation of the projection exposure apparatus with a laser plasma source, the second wavelength corresponds, in particular, to the wavelength of the laser used for generating the source plasma. When a $CO_2$ laser is used, this is e.g. the wavelength of 10.6 µm. The radiation having the second wavelength cannot be used for imaging the structure-bearing mask, since the wavelength is too long for imaging the mask structures in the nanometers range. The radiation having the second wavelength therefore leads only to an undesired background brightness in the image plane. Furthermore, the radiation having the second wavelength leads to heating of the optical elements of the illumination optical unit and of the projection optical unit. For these two reasons, provision is made of a filter element for suppressing radiation having the second wavelength.

Spectral filters are thus used as filter elements, which spectral filters are intended to filter out undesired light components and comprise membrane films produced from a material which transmits radiation having the first desired wavelength and absorbs or reflects radiation having a second wavelength. By way of example, this can be a zirconium film having a thickness in the range of less than or equal to 500 nm, or the filter can be constructed from alternating zirconium and silicon layers. Spectral filters, so-called spectral purity filters, are known in the prior art and described in EP 1 708 031 A2, for example.

Filters with thin films have the disadvantage, however, that they can be destroyed during operation in the event of corresponding thermal loads as a result of the radiation and/or other mechanical loads, such as vibrations.

WO 2007/107783 A1 accordingly describes a method for repairing a spectral filter, wherein carbon-containing material for repairing the filter is filled into a corresponding chamber, at the end of which a spectral filter is arranged, if it is ascertained that gas is escaping from the chamber via the filter, such that it can be deduced that the filter exhibits damage. Gas sensors that can determine the corresponding gas flow are provided for this purpose.

Although such a method makes it possible to ascertain that the filter exhibits damage, and additionally opens up the possibility of the filter being repaired directly by the addition of carbon-containing material, it is necessary here to provide the corresponding prerequisites for the possibility for determining a loss of gas and the addition of a carbon-containing material into a chamber.

Furthermore, as a result of the destruction of a corresponding spectral filter there is the problem that neighboring regions of the projection exposure apparatus can be contaminated. Particularly in regions which are operated under ultrahigh vacuum as is the case in adjacent regions of the illumination system of a projection exposure apparatus, where the corresponding spectral filters are usually used, destruction of the spectral filter leads to considerable contamination of the system. Since there is additionally the difficulty that such systems are often difficult to access, the required cleaning leads to a very high outlay.

The problem area described occurs not only in the case of the spectral filters described above, but rather can generally occur in the case of corresponding filters with thin membrane films which can for example also be used for filtering debris or the like.

OBJECTS AND SUMMARY OF THE INVENTION

Therefore, one object addressed by the present invention is that of specifying a projection exposure apparatus and a method for operating a projection exposure apparatus in which the outlay for cleaning the projection exposure apparatus following destruction of a filter element, and in particular of a spectral filter, can be reduced.

The invention is based on the insight that the outlay for cleaning a projection exposure apparatus can be minimized by correspondingly limiting the contamination of the projection exposure apparatus in the event of a filter element being destroyed. Accordingly, it is proposed to provide at least one blocking element which is movable between a standby position and a barrier position, wherein the movement of the blocking element can be effected at least in a manner dependent on a signal of a sensor device that monitors a filter that could give rise to contamination of the projection exposure apparatus as a result of the destruction of the filter. Accordingly, the concept of the present invention involves bringing a blocking element to a barrier position if the destruction of a filter is determined by the sensor device, in order to limit the contamination of the projection exposure apparatus by providing the blocking element in the barrier position. By providing the blocking element in the barrier position the intention is to prevent parts of the destroyed or damaged filter from passing into regions of the projection exposure apparatus in which they can be removed again only with difficulty. In this case, the sensor device monitors the state of the filter and outputs a corresponding signal in the event of destruction or damage, with the result that the blocking element is moved to the barrier position.

Accordingly, an open-loop and/or closed-loop control unit can be provided, which performs the open-loop and/or closed-loop control of the movement of the blocking element from the standby position to the barrier position if destruction or damage of the filter has been ascertained by the sensor device. In the case of closed-loop control, a feedback can additionally be effected in such a way that the state of the blocking element is detected, that is to say e.g. its position, and this influences the control of the movement of the blocking element.

Furthermore, at least one actuator can be provided which is used to effect the actuation of the blocking element, that is to say the movement of the blocking element from the standby position to the barrier position.

The actuator provides an actuating energy on the basis of an actuating signal, with which actuating energy the blocking element can be moved. The actuating signal can be provided by the sensor device or the open-loop and closed-loop control unit, which can in turn receive an output signal of the sensor device.

In the same way as the sensor device, the actuator can be realized by an individual component or by an assembly. Accordingly, the terms sensor device and actuator are used comprehensively for describing corresponding components.

The actuating energy can be converted by the actuator directly from the actuating signal, such as e.g. in the case of a piezoactuator, or can be made available by the conversion of the energy from a corresponding energy supply, such as e.g. a current source or a compressed air generator, and/or from an energy store, such as a compressed air accumulator, into mechanical energy. An energy store is advantageous to the effect that enough energy for rapidly moving the blocking element to the barrier position is available in a sufficient quantity abruptly upon retrieval.

The actuator can provide actuating energy on the basis of electrical energy or flow energy. By way of example, an actuator can comprise a component from the group comprising electric motors, linear motors, electromagnets, piezoactuators, magnetostrictive actuators, electrostrictive actuators, pneumatic actuating devices and valves.

The energy store can be selected from the group comprising mechanical energy stores, mechanical springs, gas pressure accumulators and electrical energy stores, such as capacitors.

The blocking element can comprise a surface area element and a bearing device. By blocking off transport paths, the surface area element has the effect that as few contaminants as possible in the event of the destruction of a filter pass into undesired regions of the projection exposure apparatus, while the bearing device keeps the blocking element or blocking elements both in the standby position and in the barrier position and enables the movement between the two positions.

The bearing device can accordingly be embodied as a rotary bearing or a linear bearing, wherein a rotary bearing enables a rotary or pivoting movement, while the linear bearing enables a linear movement of the surface area element of the blocking element. Furthermore, the bearing device can enable or predefine movements of the surface area element which are combined from rotary or pivoting movements and linear movements, in particular spiral movements. Angularly accelerated movements with at least one portion of a rotary movement are thus possible as well.

The bearing device is intended to enable an as far as possible frictionless or low-friction movement of the surface area element for a fast actuation of the blocking element. This can be realized with air bearings or with suitable coatings of the bearing components with, for example, diamond like carbon (DLC) layers. In the case of air bearings, it is merely necessary to suitably separate the air or gas feed to the bearings from the vacuum regions of the projection exposure apparatus.

The surface area element can have a size of 25 cm$^2$ to 3000 cm$^2$, in particular 250 to 2500 cm$^2$, and preferably 400 cm$^2$ to 100 cm$^2$, in order to make it possible to sufficiently block off part of a projection exposure apparatus, and in particular high-vacuum regions of a projection exposure apparatus.

The actuation time for moving the blocking element from the standby position to the barrier position can be less than or equal to 50 ms. With such fast actuation times, a sufficient reaction time is provided to make it possible, in the case of destruction of a filter, to sufficiently block off regions that must not be contaminated in a projection exposure apparatus.

A plurality of blocking elements can be arranged with respect to one another such that together they form a barrier region. Preferably, two to six blocking elements together can form a barrier region. It is thereby possible to block off larger regions or, given a predefined dimensioning of the region to be blocked off, to realize shorter actuation times, since the individual blocking element has to cover a shorter distance from the standby position to the barrier position.

In particular, a plurality of blocking elements can be arranged such that they are arranged and/or movable, in the direction of the beam path, one behind another and/or in a laterally offset manner or angularly with respect to one another with the direction of the beam path as axis of rotation.

BRIEF DESCRIPTION OF THE DRAWINGS

In the accompanying drawings, purely schematically

Further advantages, characteristics and features of the present invention will become clear in the course of the following detailed description of exemplary embodiments with reference to the accompanying drawings. However, the invention is not restricted to these exemplary embodiments.

DETAILED DESCRIPTION OF EXEMPLARY EMBODIMENTS

Figure 1:
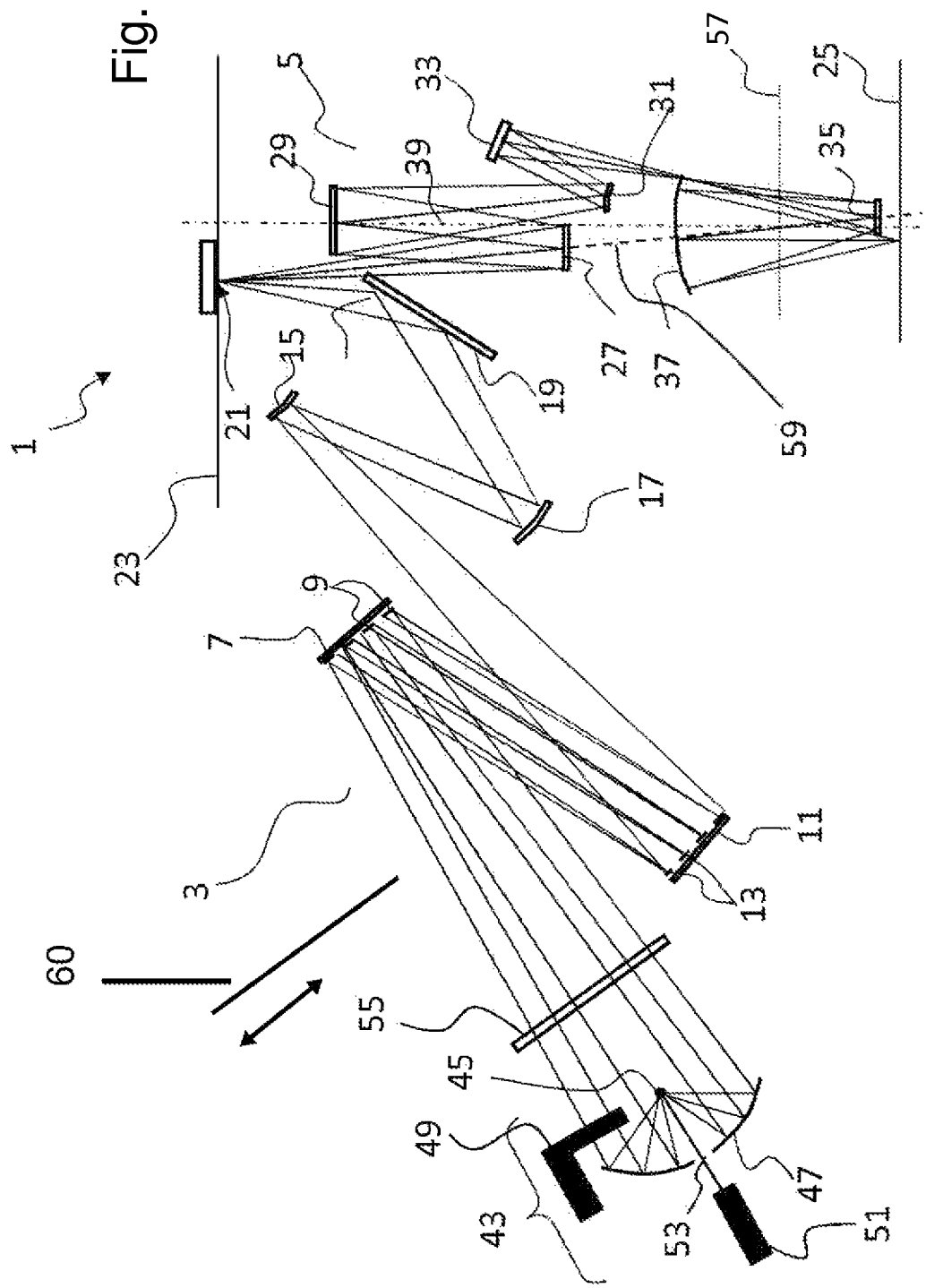
FIG. 1 shows a projection exposure apparatus for microlithography according to the prior art such as can be used in the case of the present invention.

FIG. 1 shows a configuration of a projection exposure apparatus 1 according to the invention having an illumination optical unit 3 and a projection optical unit 5. In this case, the illumination optical unit 3 comprises a first optical element 7 having a plurality of reflective first facet elements 9 and a second optical element 11 having a plurality of second reflective facet elements 13. A first telescope mirror 15 and a second telescope mirror 17 are arranged in the light path downstream of the second optical element 11, both of said telescope mirrors being operated with normal incidence, that is to say that the radiation impinges on both mirrors at an angle of incidence of between 0° and 45°. In this case, the angle of incidence is understood to mean the angle between incident radiation and the normal to the reflective optical surface. A deflection mirror 19 is arranged downstream in the beam path and directs the radiation impinging on it onto the object field 21 in the object plane 23. The deflection mirror 19 is operated with grazing incidence, that is to say that the radiation impinges on the mirror at an angle of incidence of between 45° and 90°.

A reflective structure-bearing mask is arranged at the location of the object field 21, said mask being imaged into the image plane 25 with the aid of the projection optical unit 5. The projection optical unit 5 comprises six mirrors 27, 29, 31, 33, 35 and 37. All six mirrors of the projection optical unit 5 each have a reflective optical surface that runs along a surface that is rotationally symmetrical about the optical axis 39.

The projection exposure apparatus according to FIG. 1 furthermore comprises a light source unit 43, which directs radiation onto the first optical element 7. In this case, the light source unit 43 comprises a source plasma 45 and a collector mirror 47. The light source unit 43 can be designed in various embodiments. A laser plasma source (LPP laser pulsed plasma) is illustrated. With this type of source, a narrowly delimited source plasma 45 is generated by a small material droplet being produced by a droplet generator 49 and being brought to a predetermined location, where the material droplet is irradiated with a high-energy laser 51, such that the material undergoes transition to a plasma state and emits radiation in the wavelength range of 5 nm to 15 nm. In this case, the laser 51 can be arranged in such a way that the laser radiation falls through an opening 53 in the collector mirror before it impinges on the material droplet. By way of example, an infrared laser having the wavelength of 10 μm is used as the laser 51. Alternatively, the light source unit 43 can also be designed as a discharge source, in which the source plasma 45 is generated with the aid of a discharge. In both cases, alongside the desired radiation having a first wavelength in the wavelength range of 5 nm to 15 nm, which is emitted by the source plasma, radiation having a second, undesired wavelength also occurs. This involves e.g. radiation emitted by the source plasma outside the desired wavelength range of 5 nm to 15 nm or, particularly when a laser plasma source is used, laser radiation that was reflected from the source plasma. The second wavelength is thus typically in the infrared range having a wavelength of 0.78 μm to 1000 μm, in particular in the range of 3 μm to 50 μm. During the operation of the projection exposure apparatus with a laser plasma source, the second wavelength corresponds, in particular, to the wavelength of the laser 51 used for generating the source plasma 45. When a $CO_2$ laser is used, this is e.g. the wavelength of 10.6 μm.

The radiation having the second wavelength cannot be used for imaging the structure-bearing mask at the location of the object field 21, since the wavelength is too long for imaging the mask structures in the nanometers range. Therefore, particularly in the wavelength range of 100 nm to 300 nm (DUV deep ultraviolet), the radiation having the second wavelength leads to an undesired background brightness in the image plane 25. Furthermore, the radiation having the second wavelength particularly in the infrared range leads to heating of the optical elements of the illumination optical unit and of the projection optical unit. For these two reasons, according to the invention provision is made of a filter element 55 for suppressing radiation having the second wavelength.

The filter element 55 is arranged in the beam path between the light source unit 43 and the first reflective optical element 7 of the illumination optical unit 3. In this way, the radiation having the second wavelength is suppressed as early as possible. Alternatively, the filter element 55 can also be arranged at other positions in the beam path. The filter element can comprise a film having a thickness of less than 500 nm, wherein the material and thickness of the film are embodied in such a way that the film absorbs a proportion of at least 90% of the radiation having the second wavelength and transmits a proportion of 70% of the radiation having the first wavelength.

The radiation that has now been spectrally purified in this way illuminates the first reflective optical element 7. The collector mirror 49 and the first reflective facet elements 9 have an optical effect such that images of the source plasma 45 arise at the locations of the second reflective facet elements 13 of the second optical element 11. For this purpose, firstly the focal length of the collector mirror 49 and that of the first facet elements 9 are chosen in accordance with the spatial distances. This is done, for example, by providing the reflective optical surfaces of the first reflective facet elements 9 with suitable curvatures. Secondly, the first reflective facet elements 9 have a reflective optical surface with a normal vector whose direction defines the orientation of the reflective optical surface in space, wherein the normal vectors of the reflective surfaces of the first facet elements 9 are oriented in such a way that the radiation reflected by a first facet element 9 impinges on an assigned second reflective facet element 13. The second reflective facet element 11 is arranged in a pupil plane of the illumination optical unit 3, which is imaged onto the exit pupil plane with the aid of the mirrors 15, 17 and 19. In this case, the exit pupil plane of the illumination optical unit 3 corresponds exactly to the entrance pupil plane 57 of the projection optical unit 5. Consequently, the second optical element 11 lies in a plane that is optically conjugate with respect to the entrance pupil plane 57 of the projection optical unit 5. For this reason, the intensity distribution of the radiation on the second optical element 11 is in a simple relationship with the angle-dependent intensity distribution of the radiation in the region of the object field 21. In this case, the entrance pupil plane of the projection optical unit 5 is defined as the plane perpendicular to the optical axis 39 in which the chief ray 59 intersects the optical axis 39 at the midpoint of the object field 21.

The task of the second facet elements 13 and of the downstream optics comprising the mirrors 15, 17 and 19 is to image the first facet elements 9 in a superimposing fashion onto the object field 21. In this case, superimposing imaging is understood to mean that images of the first reflective facet elements 9 arise in the object plane and at least partly overlap there. For this purpose, the second reflective facet elements 13 have a reflective optical surface with a normal vector whose direction defines the orientation of the reflective optical surface in space. For each second facet element 13, the direction of the normal vector is chosen such that the first facet element 9 assigned to it is imaged onto the object field 21 in the object plane 23. Since the first facet elements 9 are imaged onto the object field 21, the form of the illuminated object field 21 corresponds to the outer form of the first facet elements 9. The outer form of the first facet elements 9 is therefore usually chosen to be arcuate such that the long boundary lines of the illuminated object field 21 run substantially in the form of an arc of a circle about the optical axis 39 of the projection optical unit 5.

Between the filter 55 and the first reflective element 7, laterally with respect to the beam path, a blocking element 60 is shown in its standby position, wherein the double-headed arrow shows the possibility for movement of the blocking element 60 to the barrier position. The barrier position is a position which is arranged in the beam path, for example, and is situated between the first reflective element 7 and the filter 55, such that destruction products which arise in the event of the destruction of the filter 55 cannot pass to the first reflective element 7.

Figure 2:
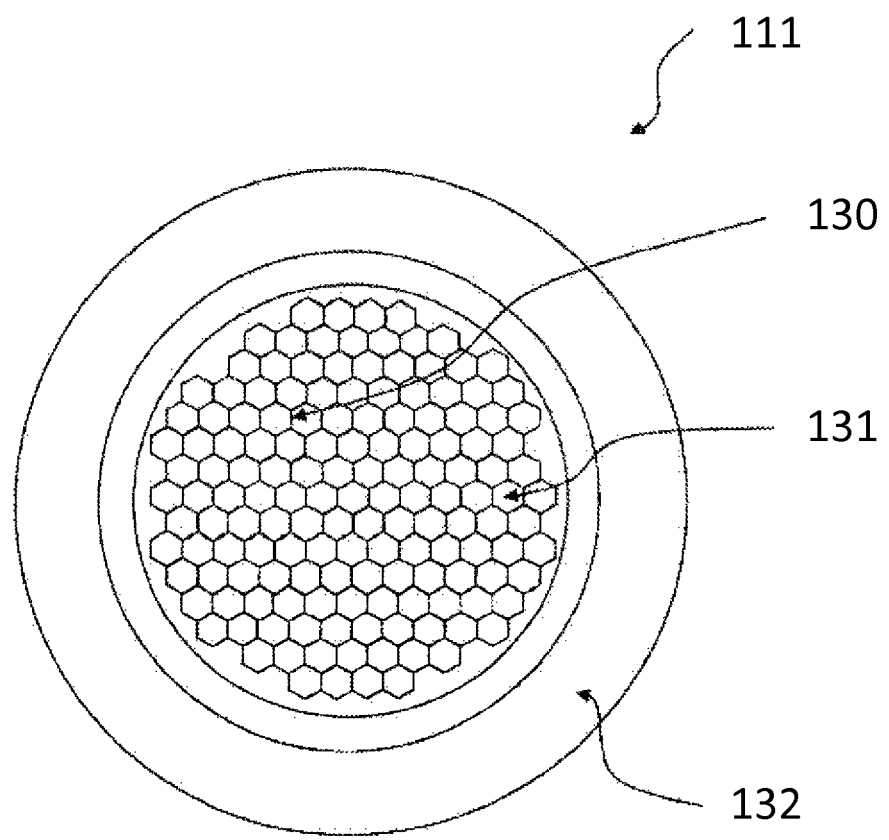
FIG. 2 shows a spectral filter such as can be used in the projection exposure apparatus from FIG. 1.

FIG. 2 shows a filter 111 such as can be used for example in the projection exposure apparatus from FIG. 1. The filter 111 has a circular frame 132 accommodating the actual filter comprising a multilayer structure having alternating zirconium and silicon layers 131. A grating 130 in a honeycomb structure is additionally provided for stabilizing the zirconium/silicon layers 131.

However, in the case of filters of this type there is furthermore the problem that despite the stabilization of the layer structure through a honeycomb structure, the filter can tear, with the result that not only can the light from the light source unit 43 pass through unimpeded and enter into the illumination system, but also destruction products of the filter in the event of destruction can pass into the system of the projection exposure apparatus, and in particular to the optical elements arranged there.

The projection exposure apparatus, as described in FIG. 1, is operated with pulsed light, that is to say with repeatedly maximally high light intensity interrupted by times of low light intensity, wherein the maxima of the light intensity are present over time with a temporal spacing dT. The pulse duration is approximately 50 ns, for example, and the pulse frequency of the light source can be operated between 6 kHz and approximately 60 kHz, with the result that the spacing dT is between 0.2 ms and 2 ms. In the pauses between two pulses, which is also referred to as the so-called idle time, a monitoring device can check the filter, such that the monitoring device is also operated in correspondingly pulsed operation.

Figure 3:
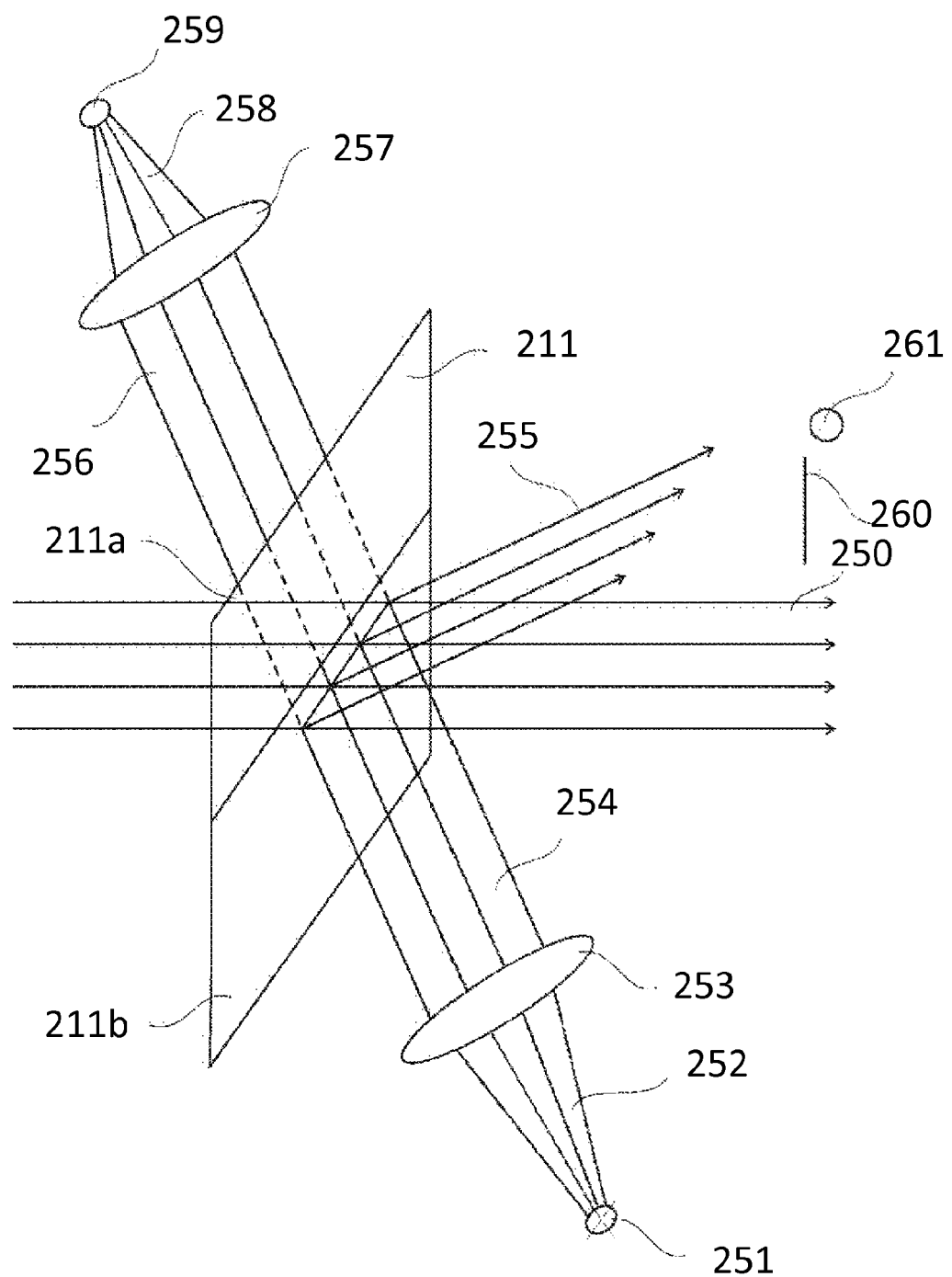
FIG. 3 shows an illustration of a monitoring device such as can be used according to the present invention.

FIG. 3 shows a monitoring device such as is used with regard to a filter 211 which can be used in the projection exposure apparatus from FIG. 1. The monitoring device comprises a light source 251, which emits light 252 that is focused by an optical arrangement, represented by a converging lens 253, in order to form a defined monitoring light beam 254, which is directed onto the filter 211. The cross section of the monitoring light beam 254 can be dimensioned to be large enough that the entire filter 211 is irradiated. Alternatively, the radiation cross section of the monitoring light beam 254 can also be smaller than the filter 211, such that, by utilizing a deflection device (not shown), the monitoring light beam 254 can be guided (scanned) over the surface of the filter 211. Furthermore, it is also possible to subdivide the filter 211 into two or more regions, namely the filter region 211a and the filter region 211b, and to provide for each of the filter regions 211a, 211b a dedicated monitoring device, which can then in turn be designed such that the monitoring light beam 254 covers the entire filter region 211a, 211b or is guided over the filter region 211a, 211b in a scanning movement.

Since the filter 211 is designed as a spectral filter, for example, part of the monitoring light beam 254 will pass through the filter 211 and impinge as light beam 256 on the second part of the optical arrangement of the monitoring device, which is again illustrated as a converging lens 257, in order to be directed in a conditioned beam 258 onto a detector 259. The light beam 258 can be detected by the detector 259 and, for example, the intensity thereof can also be determined.

If the filter 211 is then damaged, an alteration of the transmitted light will result, which can be detected by the detector 259, such that the state of the filter 211 can be deduced by a comparison of a currently measured light intensity with an earlier measured light intensity.

For this purpose, the monitoring device can have a corresponding open-loop and/or closed-loop control unit, which, just like the open-loop and/or closed-loop control unit for the blocking element 60, can preferably be realized through a data processing unit with corresponding software in order to determine a result for the state of the filter 211. With the monitoring result, it is possible directly to effect signal outputting to one or a plurality of blocking elements or to actuators and/or open-loop and/or closed-loop control units thereof in the vicinity of the filter 211 for the purpose of moving the blocking element or blocking elements to the barrier position. The blocking element or blocking elements is/are moved to the barrier position. The open-loop and/or closed-loop control unit (not illustrated) for the open-loop and/or closed-loop control of the monitoring device can simultaneously be used for the open-loop and/or closed-loop control of the blocking element or blocking elements and can be formed by a data processing system equipped with corresponding software.

Alongside the transmitted beam 256 of the monitoring light beam 254, part of the light is also reflected at the filter 211 and generates a reflected light beam 255, which can, for example, likewise be detected by a detector 261. Embodiments are also conceivable in which only the reflected beam 255 is used for detecting the state of the filter.

Since the filter is used substantially for filtering the used light 250 of the projection exposure apparatus, the arrangement of the monitoring device should be implemented such that the monitoring device does not introduce any light into the beam path of the projection exposure apparatus; this applies particularly in the case of non-pulsed operation. Accordingly, the light source 251 and the detectors 259 and 261 are arranged such that the beam path of the monitoring device with the monitoring light beam 254, the transmitted beam 256 and/or the reflected beam 255 is provided in each case transversely with respect to the beam path or the light propagation direction of the used light 250 of the projection exposure apparatus. In particular, the angles between the monitoring light beam 254 and the transmitted and/or reflected light beam 256, 255, on the one hand, and the direction of propagation of the used light 250 through the filter 211, on the other hand, can be chosen in the range of 30° to 90°, preferably 45° to 90°, relative to the direction of propagation of the light beams.

In order additionally to prevent stray light or other reflected light from passing into the beam path of the used light, the monitoring device can comprise at least one light trap which absorbs light from the light source or reflected or transmitted light or prevents it from penetrating into the beam path of the used light. By way of example, FIG. 3 schematically illustrates a stop device 260 used for this purpose.

Figure 4:
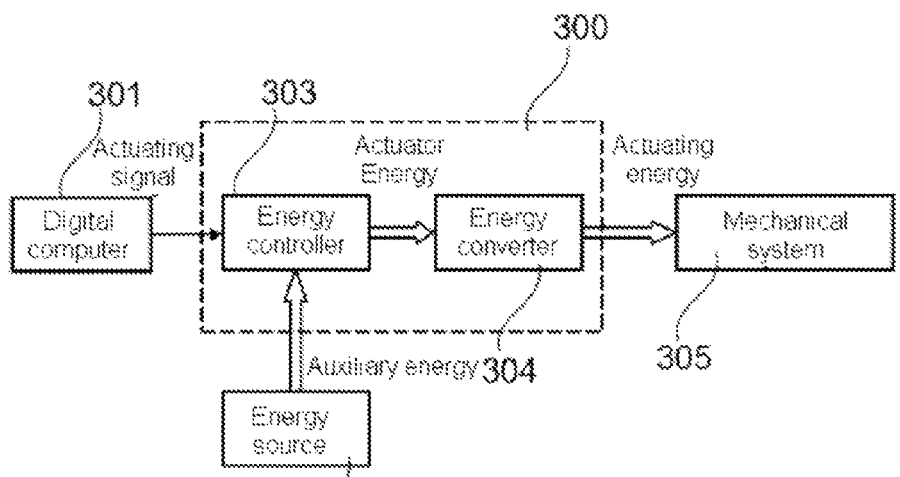
FIG. 4 shows an illustration of the manner of operation of an actuator such as can be used in the present invention.

FIG. 4 shows, in a schematic diagram, the principles of the manner of operation of an actuator such as can also be used in the case of the present invention. The actuator 300 receives an actuating signal, for example from a digital computer 301 in the exemplary embodiment shown. Alternatively, instead of digital signals, data buses or analog signals having current and/or voltage values can also be used as actuating signals. The actuator 300 comprises an energy controller 303 and an energy converter 304, wherein the energy controller controls the energy flow from an energy source 302 and the energy converter 304 brings about the actual conversion into mechanical output energy, which is then available to a mechanical system 305, which is provided by the blocking element in the case of the present invention.

By way of example, the actuator can be provided by an electric motor, in the case of which the energy source is provided by a power supply and the actuating signal has the effect that the motor controller as energy controller 303 sets a specific rotor rotational speed, which is then available for actuation of a blocking element. In the case of an actuator which acts pneumatically on the basis of flow energy, a valve as energy controller can cause the pressure medium conveyed by a pump, for example air, to act on a piston which is set in motion by the pressure, in order thus to move the mechanical system 305 in the form of a blocking element.

In accordance with this principle, in the case of the present invention a variety of different actuators or actuator systems can be used, comprising for example electric motors, electromagnets, piezoactuators, magnetostrictive actuators, electrostrictive actuators or pneumatically operated actuators.

The energy source 302 can also be provided in the form of an energy store, such as, for example, mechanical energy stored in a prestressed spring or pneumatic energy stored in a pressure container. The energy controller 303 of the actuator 300 then causes the stored energy to be released after the actuating signal has been received, such that said energy can be released into a mechanical energy for actuating the mechanical system 305, that is to say the blocking element.

Figure 5:
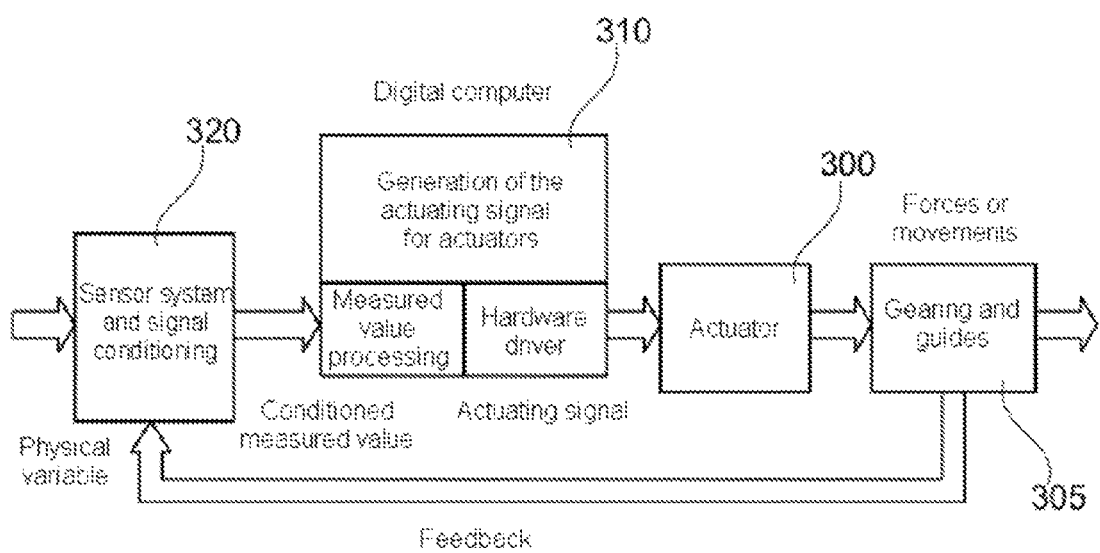
FIG. 5 shows an illustration of a closed-loop control such as can be used in the case of the present invention.

FIG. 5 shows the interaction of an actuator 300 with a closed-loop control device 310, which is embodied through a digital computer and corresponding software. The closed-loop control device 310 is connected to a sensor or a plurality of sensors or sensor units 320 and receives measured values detected by the sensors, which measured values are processed in the closed-loop control unit 310 to form an actuating signal that is output to the actuator 300. The actuator 300 can in turn actuate a corresponding mechanical system 305, as already explained above. If the mechanical system 305 is monitored by sensors 320, a feedback or return can be effected, such that it is possible to use the detected measured values with regard to the mechanical system 305 for the further control of the actuator 300. In the case of the present invention, this can be effected, for example, by monitoring the position in which the blocking element is situated. By way of example, if the blocking element is already situated in its barrier position, then the closed-loop control unit 310 can end a further actuation of the actuator 300, provided that this is not necessary for maintaining the position of the blocking element.

Figure 6:
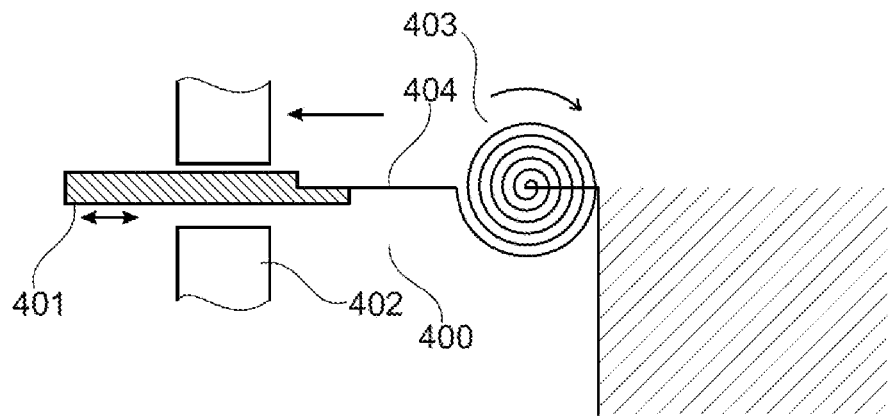
FIG. 6 shows an illustration of a first exemplary embodiment of a blocking element with an actuator.

FIGS. 6 to 9 show examples of blocking elements and actuators such as can be used in the case of the present invention. FIG. 6 shows a first blocking element 400, which comprises a surface area element 401 in the form of a plate and also a bearing 402, which bears the surface area element 401 and guides it in a linear movement in accordance with the double-headed arrow.

The linear movement is brought about by a prestressed spiral spring 403 connected to the surface area element 401 via a web 404. In conjunction with the spiral spring 403, a trigger element (not illustrated in more specific detail) is provided, which represents the energy controller of an actuator. The energy controller of the actuator or the trigger element can be formed by a holding element which holds the spiral spring in the prestressed position. By way of example, the energy controller can be formed by a piezoelement which releases the prestressed spiral spring 403 as a result of an actuating signal being received, such that the energy stored in the prestressed spiral spring 403 is converted into a linear movement along the arrow, such that the surface area element 401 of the blocking element 400 is brought to a barrier position.

Figure 7:
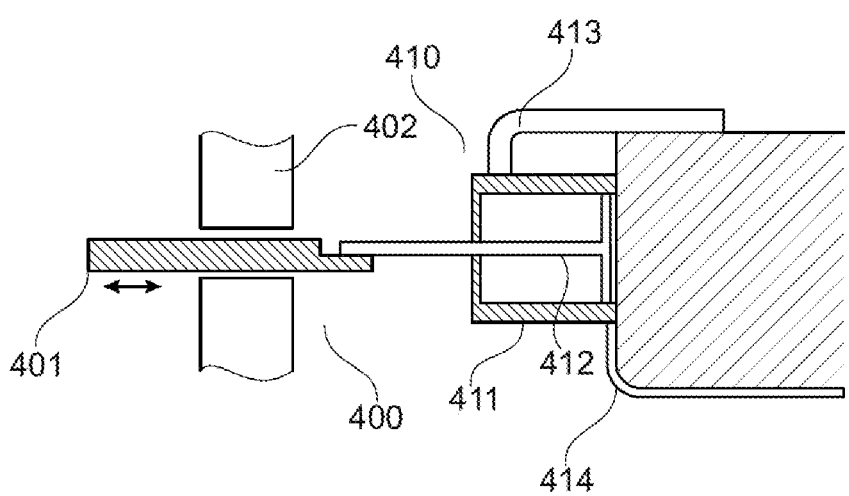
FIG. 7 shows an illustration of a second exemplary embodiment of a blocking element with an actuator.

In the case of the embodiment in FIG. 7, the blocking element 400 is constructed in the same way as the blocking element 400 from FIG. 6. However, the actuator is embodied as a pneumatic actuator 410 comprising a cylinder 411, in which a piston 412 is arranged in a displaceable manner. The cylinder 411 comprises two supply and discharge lines 413, 414, of which one has its opening on one side of the piston into the cylinder, while the other has its opening on the other side of the piston. As a result, through corresponding introduction of pressure media, the piston can be moved to and fro in the cylinder 411. The supply and discharge lines 414, 413 are connected to a pressure medium source or a pressure medium accumulator, wherein the pneumatic actuator 410 has a valve (not illustrated in more specific detail) as energy controller, through which the pressure medium, such as compressed air, for example, is introduced either through one supply or discharge line 413 or through the other supply or discharge line 414 and pressure medium is correspondingly discharged on the other side, with the result that the piston 412 moves linearly in the cylinder 411.

Figure 8:
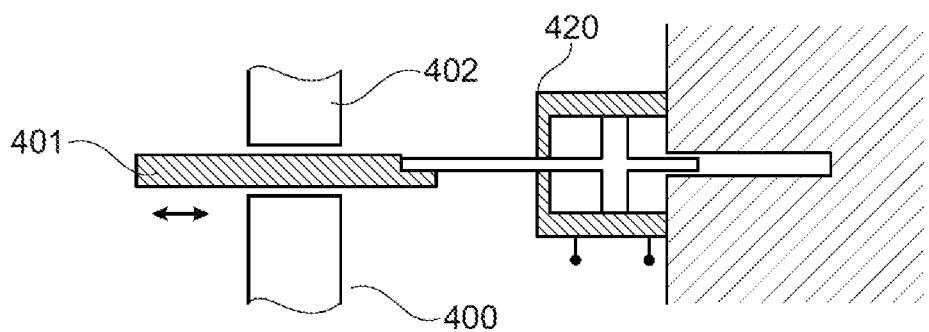
FIG. 8 shows an illustration of a third exemplary embodiment of a blocking element with an actuator.

FIG. 8 shows a further exemplary embodiment of a combination of a blocking element 400 and an actuator, which is embodied as an electrical actuator in the case of the embodiment in FIG. 8. The blocking element 400 is once again designed in the same way as in the exemplary embodiments in FIGS. 6 and 7 and thus comprises a surface area element 401 mounted such that it is movable to and fro linearly in a bearing 402. The drive is effected by means of an electric linear motor 420, which is illustrated only schematically in FIG. 8.

Figure 9:
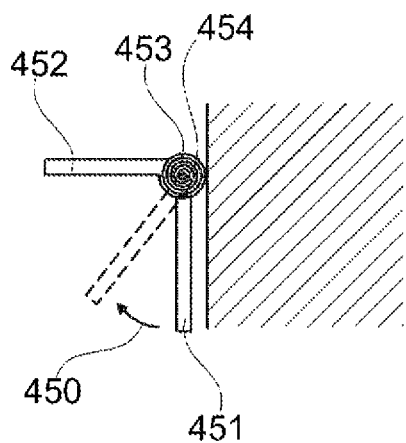
FIG. 9 shows an illustration of a fourth exemplary embodiment of a blocking element with an actuator.

FIG. 9 shows a further exemplary embodiment of a blocking element 450, which again has a surface area element 451, which, however, is mounted rotatably with a rotary joint 454, such that the movement from a standby position to the barrier position 452 via an intermediate position illustrated by dashed lines does not take place with a linear movement, as in the exemplary embodiments in FIGS. 6 to 8, but rather with a rotary movement.

As part of the actuator which functions as an energy converter and simultaneously acts as an energy store, a spiral spring 453 is once again provided, which is in a prestressed state in the standby position of the surface area element 451 and is transferred to a stress-relieved state for the purpose of moving the surface area element 451 to a barrier position, for which purpose, in a manner similar to that in the embodiment in FIG. 6, a corresponding holding element that holds the spiral spring 453 in the prestressed state is withdrawn from the holding position by an energy controller of the actuator, such that the spiral spring is released and the surface area element 451 of the blocking element 450 can be moved to the barrier position 452.

Figure 10:
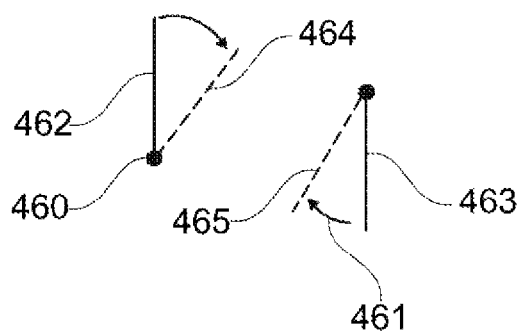
FIG. 10 shows an illustration of the interaction of two blocking elements in accordance with the embodiment from FIG. 9.
Figure 11:
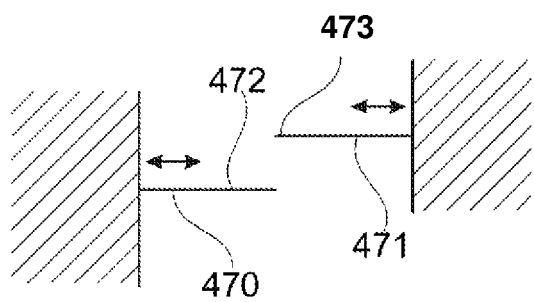
FIG. 11 shows an illustration of the interaction of a plurality of blocking elements.

FIGS. 10 to 13 show the arrangement of a plurality of blocking elements which interact with one another in order to define a barrier region. In this regard, FIGS. 10 and 11 show in each case two blocking elements 460, 461 and 470, 471, respectively, which together cover a larger region than they could cover individually. As a result, each individual blocking element can be given smaller dimensions, which correspondingly shortens the actuation time. In the case of the embodiment of FIG. 10, the surface area elements 462, 463 are brought by rotary movement in the direction of a barrier position, the positions 464 and 465 illustrated by dashed lines merely illustrating intermediate positions. In FIG. 11, by contrast, the blocking elements 470 and 471 or their surface area elements 472, 473 are brought to the barrier position by linear movement in accordance with the double-headed arrows shown.

In the case of the embodiment of FIG. 11, two blocking elements 470, 471 are arranged one behind the other in a direction transversely with respect to the plane of the surface area elements, which corresponds for example to the direction of light propagation in the beam path, and the surface area elements of the blocking elements are situated in a manner laterally offset with respect to one another in relation to the light propagation direction in the barrier position, in order to form a larger barrier region with surface area elements having smaller dimensions.

Figure 12:
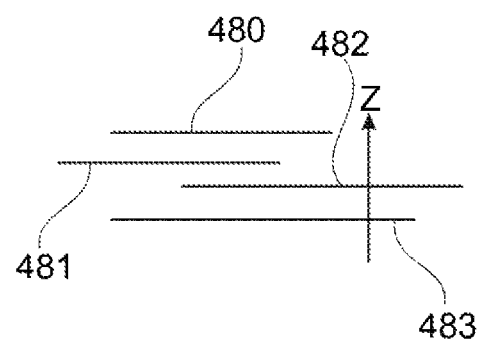
FIG. 12 shows an illustration of a further embodiment of an arrangement of a plurality of blocking elements for forming a barrier region.

In the case of the exemplary embodiment in FIG. 12, a total of four blocking elements 480 to 483 are arranged one behind another in a direction Z, wherein the position of the individual blocking elements 480 to 483 is shifted or laterally offset in a direction transversely with respect to the Z-direction. As a result, a particularly effective blocking-off effect can be realized in the Z-direction, for example the light propagation direction in the beam path of a projection exposure apparatus.

Figure 13:
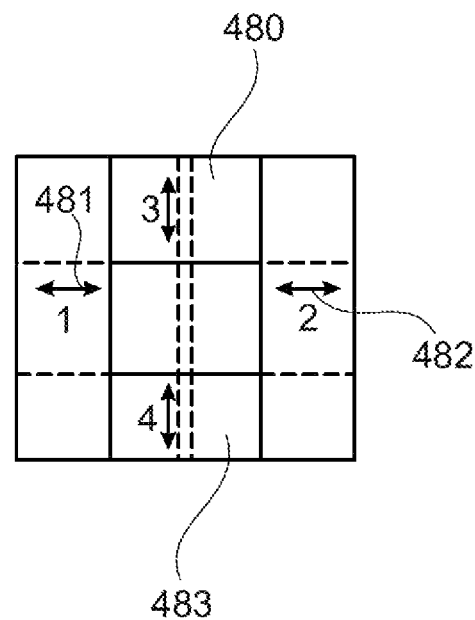
FIG. 13 shows an illustration of the arrangement of a plurality of blocking elements for forming a barrier region.

FIG. 13 shows a plan view of the arrangement of the blocking elements 480 to 483 from FIG. 12. It can be seen here that the different blocking elements can be moved into the barrier positions from different directions, with the result that with a few blocking elements it is possible to obtain a barrier region for a relatively large spatial region. In this case, the blocking elements 481 and 482 move toward one another during the movement from the standby position to the barrier position and transversely with respect to the direction of movement of the blocking elements 480 and 483, which likewise in turn move toward one another.

Figure 14:
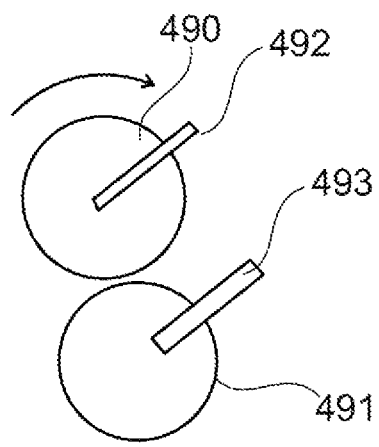
FIG. 14 shows a further illustration of a plurality of blocking elements.

FIG. 14 shows a further embodiment, wherein the blocking elements 490, 491 are formed by rotating disks on which corresponding surface area elements 492, 493 are provided, which can be brought to the barrier position and back to the standby position by rotation or pivoting of the disks. In this case, the disks can be mounted eccentrically.

Although the present invention has been explained in detail on the basis of the exemplary embodiments presented, persons skilled in the art will understand the present invention, its attendant advantages and, further, that the invention is not restricted to said exemplary embodiments, rather that modifications are possible in a manner such that individual features are omitted or different combinations of features are realized, without departing from the scope of protection of the appended claims.

What is claimed is:

1. Projection exposure apparatus for microlithography defining a beam path along which propagates electromagnetic radiation with which the projection exposure apparatus is operated, and comprising:
   at least one filter arranged in the beam path,
   at least one sensor device configured to monitor the at least one filter,
   at least one blocking element configured to move between a standby position and a barrier position, wherein the movement of the blocking element is effected in accordance with a signal of the sensor device, and wherein in the barrier position a region of the projection exposure apparatus is blocked off relative to the at least one filter such that parts of a destroyed or damaged one of the at least one filter cannot pass into the blocked-off region of the projection exposure apparatus,
   at least one of an open-loop control unit and a closed-loop control unit, and an actuator configured to actuate the blocking element, wherein the actuator comprises an energy store configured to store actuating energy.

2. Projection exposure apparatus according to claim 1, wherein the actuator provides actuating energy based on electrical energy or flow energy.

3. Projection exposure apparatus according to claim 1, wherein the actuator is selected from the group consisting essentially of electric motors, linear motors, electromagnets, piezoactuators, magnetostrictive actuators, electrostrictive actuators, pneumatic actuating devices, and valves.

4. Projection exposure apparatus according to claim 1, wherein the energy store is selected from the group consisting essentially of mechanical energy stores, mechanical springs, gas pressure accumulators, and electrical energy stores.

5. Projection exposure apparatus according to claim 1, wherein the blocking element comprises a surface area element and a bearing device.

6. Projection exposure apparatus according to claim 5, wherein the bearing device comprises at least one of a rotary bearing, a linear bearing, and a bearing combining rotary and linear movements.

7. Projection exposure apparatus according to claim 6, wherein the bearing device comprises a bearing for angularly accelerated movements or spiral movements.

8. Projection exposure apparatus according to claim 5, wherein the bearing device comprises a friction-reduced or frictionless bearing.

9. Projection exposure apparatus according to claim 8, wherein the bearing device comprises an air bearing or a bearing having bearing components of which at least one component comprises a diamond like carbon (DLC) layer.

10. Projection exposure apparatus according to claim 5, wherein the surface area element has a size between 25 cm$^2$ and 3000 cm$^2$.

11. Projection exposure apparatus according to claim 10, wherein the surface area element has a size between 250 cm$^2$ and 2500 cm$^2$.

12. Projection exposure apparatus according to claim 11, wherein the surface area element has a size between 400 cm$^2$ and 1000 cm$^2$.

13. Projection exposure apparatus according to claim 1, wherein an actuating time for moving the blocking element from the standby position to the barrier position is no more than 50 ms.

14. Projection exposure apparatus according to claim 1, wherein the blocking element comprises a plurality of individual blocking elements, arranged such that together the individual blocking elements form a barrier region.

15. Projection exposure apparatus according to claim 14, wherein the plurality of individual blocking elements is at least one of: arranged one behind another, arranged laterally offset from one another, and arranged angularly offset with respect to one another.

16. Projection exposure apparatus according to claim 14, wherein the plurality of individual blocking elements is provided with movement sequences from the standby position to the barrier position that move the individual blocking elements at least one of: at least partly counter to one another, and at angles with respect to one another.

17. Projection exposure apparatus according to claim 14, wherein the plurality of blocking elements consists of two to six individual blocking elements.

18. Projection exposure apparatus according to claim 1, wherein the electromagnetic radiation consists essentially of extreme ultraviolet radiation.

19. Method for operating a projection exposure apparatus, wherein the projection exposure apparatus comprises:
at least one filter arranged in a beam path of the projection exposure apparatus,
at least one sensor device, and
at least one blocking element configured to move between a standby position and a barrier position, said method comprising:
monitoring the at least one filter for a predetermined condition with the at least one sensor device, and generating a signal upon detection of the predetermined condition,
moving the blocking element between the standby position and the barrier position in accordance with the signal, such that in the barrier position a region of the projection exposure apparatus is blocked off relative to the at least one filter such that parts of a destroyed or damaged one of the at least one filter cannot pass into the blocked-off region of the projection exposure apparatus.

20. Method according to claim 19, wherein the predetermined condition comprises damage to or destruction of the at least one filter.

* * * * *